United States Patent [19]

Imamura

[11] Patent Number: 5,283,425
[45] Date of Patent: Feb. 1, 1994

[54] LIGHT EMITTING ELEMENT ARRAY SUBSTRATE WITH REFLECTING MEANS

[75] Inventor: Masaya Imamura, Kyoto, Japan

[73] Assignee: Rohm Co., Ltd., Kyoto, Japan

[21] Appl. No.: 10,761

[22] Filed: Jan. 29, 1993

[30] Foreign Application Priority Data

Feb. 6, 1992 [JP] Japan .................................. 4-20983

[51] Int. Cl.$^5$ ...................... H01J 40/14; H01L 27/14
[52] U.S. Cl. ............................... 250/208.1; 358/475;
257/98; 250/578.1
[58] Field of Search .................. 250/208.1, 216, 578.1;
358/475; 257/98, 88, 84; 355/67, 70, 71

[56] References Cited

U.S. PATENT DOCUMENTS

| | | | |
|---|---|---|---|
| 4,814,667 | 3/1989 | Tanaka | 250/578.1 |
| 4,956,684 | 9/1990 | Urata | 257/98 |
| 5,130,761 | 7/1992 | Tanaka | 257/98 |
| 5,132,750 | 7/1992 | Kato et al. | 257/98 |
| 5,182,445 | 1/1993 | Yamashita | 250/208.1 |
| 5,187,595 | 2/1993 | Kitani et al. | 358/475 |
| 5,196,950 | 3/1993 | Fukoka et al. | 358/475 |

FOREIGN PATENT DOCUMENTS 63-239874(A) 10/1988 Japan ..................................... 257/88

*Primary Examiner*—Michael Messinger
*Attorney, Agent, or Firm*—Dickstein, Shapiro & Morin

[57] ABSTRACT

A light emitting element array substrate includes a plurality of light emitting elements arranged in line on the substrate with less dispersion in irradiation to a surface to be irradiated and can be manufactured with a reduction of cost. The light emitting element array substrate also includes light reflecting members formed on the light emitting element array substrate about light emitting elements having less irradiation. The light reflecting members re-reflect the light emitted from the light emitting elements and also reflected by surrounding parts so that the quantity of light at portions of the light emitting element array substrate having less irradiation is complemented by the re-reflected light to level the entire irradiation in the light emitting element array substrate.

15 Claims, 4 Drawing Sheets

Prior Art

LIGHT EMITTING ELEMENT ARRAY SUBSTRATE WITH REFLECTING MEANS

BACKGROUND OF THE INVENTION

1. Field of the Invention

The present invention relates to a light emitting element array substrate used as an image sensor, a backlight of liquid crystal display and the like and also to an apparatus using such a light emitting element array substrate.

2. Description of the Related Art

As shown in FIG. 1, an LED array substrate (used as an example of light emitting element array substrate) which is constructed in accordance with the related art and which is used for light emission in image sensors and the like comprises a base 1 and a plurality of LED chips 2 arranged thereon in a line. A group of some LED chips 2 (four in this FIGURE) are connected in series with each other and with a current regulating resistor 3 to form a series circuit, as shown in FIG. 2. A plurality of such series circuits are further connected in parallel to each other. In such an arrangement, the entire LED array is energized to emit light by a source voltage V.

The characteristic of light emission in the LED array substrate 5 of such a type is shown in FIG. 3. Since the LED chips 2 are arranged equidistantly, a flat surface to be irradiated 4 will be less irradiated between each pair of adjacent LED chips 2 than directly above each of the LED chips 2. Except for the LED chips 2 at the opposite ends of the LED array substrate 5, however, a LED chip 2 can be complemented by the adjacent LED chips 2. The surface 4 can be irradiated substantially uniformly as a whole.

The opposite ends of the LED array substrate 5 become darker than the central portion thereof since the LED chips cannot be fully complemented by the adjacent LED chips 2.

If such a LED array substrate 5 is used in an image sensor, an original document will not be accurately read at its opposite ends by the image sensor. If such a LED array substrate 5 is used in a liquid crystal display, the opposite ends of the display darken and become difficult to view.

In order to overcome such a problem on the side of an apparatus incorporating the aforementioned type of LED array substrate, it has been proposed that light reflecting plates are located around an optical path from an LED array to a surface to be irradiated, as disclosed in Japanese Patent Application Nos.: Hei 3-250093 and Hei 4-20. Light from the LED array is reflected several times within the optical path to form a leveled light which irradiates the surface uniformly.

In order to overcome the same problem on the side of the LED array substrate itself, some proposals have been made, including decreasing a spacing between the extreme LED chip and the adjacent one at each end of the LED array substrate, increasing the brightness of only LED chips in an LED array substrate that are at the opposite ends and subjecting only LED chips in an LED array substrate that are at the opposite ends to more current. Thus, the surface can be uniformly irradiated by the LED array substrate as a whole.

However, these proposals have the following disadvantages: If the apparatus incorporating the LED array substrate is modified to overcome the aforementioned problems, the high manufacturing cost and a spatial limitation is brought by increasing of the number of parts. On the other hand, if the LED array substrate itself is modified to overcome the problems of the related art, decreasing a spacing between the extreme LED chip and the adjacent one at each end of the LED array substrate is troublesome in designing. The increase of brightness in the LED chips only at the opposite ends of the LED array substrate requires time to select such ones from many LED chips and this selection step makes the manufacturing cost high. When only the LED chips are subjected to more current, their service lives will be decreased.

SUMMARY OF THE INVENTION

It is therefore an object of the present invention to provide a light emitting element array substrate which has substantially no dispersion in quantity of light and which can be manufactured more inexpensively, and to provide an apparatus incorporating such a light emitting element array substrate The present invention provides a light emitting element array substrate which comprises a plurality of light emitting elements arranged on the substrate and light reflecting means formed on the substrate about part of the light emitting elements The light reflecting means may be formed on the light emitting element array substrate at the desired location, that is, at a position where the irradiation of light is partially reduced and particularly at each end of the light emitting element array substrate Even if the surface above the opposite ends of the substrate receives less light than the central portion thereof, the light is reflected from parts around the surface to be irradiated back to the substrate and again reflected toward the surface by the light reflecting means. As a result, the light reaching the surface becomes a combination of the light from the LED chips themselves with the reflected light. Thus, the quantity of light can be increased to irradiate the surface more uniformly.

Furthermore, the light reflecting means can reduce the dispersion in quantity of light reaching the surface with reduced cost. Particularly, if a letter or letters is/are to be printed on the substrate by the use of the silk-screen printing technique, the light reflecting means can be simultaneously formed by printing a thermoplastic resin or the like. Therefore, the light emitting element array substrate can be manufactured more inexpensively. Even if die-bonding or wire-bonding is to be carried out, any special operation is not required so there is no worry of increase in cost.

DETAILED DESCRIPTION OF THE PREFERRED EMBODIMENTS

Figure 1:
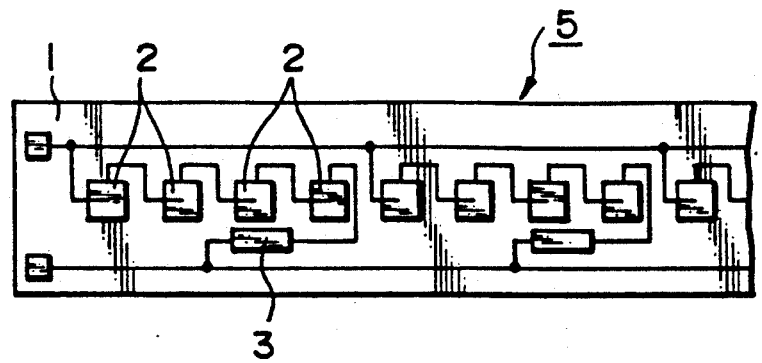
FIG. 1 is a plan view of a light emitting element array substrate constructed in accordance with the related art.
Figure 2:
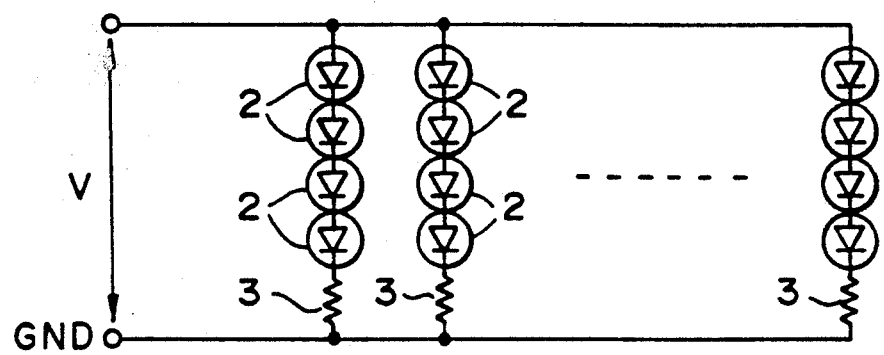
FIG. 2 is a circuit diagram illustrating the connection between the respective light emitting elements in the light emitting element array substrate of the related art.
Figure 3:
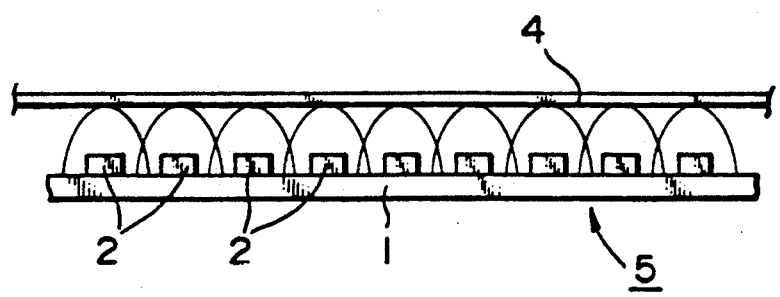
FIG. 3 is a schematic side view illustrating the emission areas of the respective light emitting elements in the light emitting element array substrate of the related art.
Figure 4:
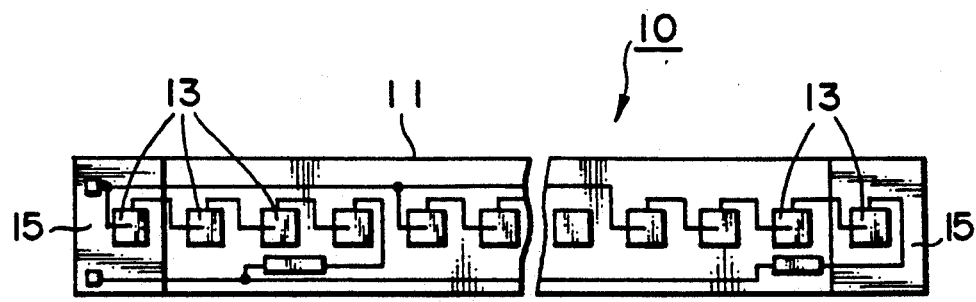
FIG. 4 is a plan view showing one embodiment of a light emitting element array substrate constructed in accordance with the present invention.
Figure 5:
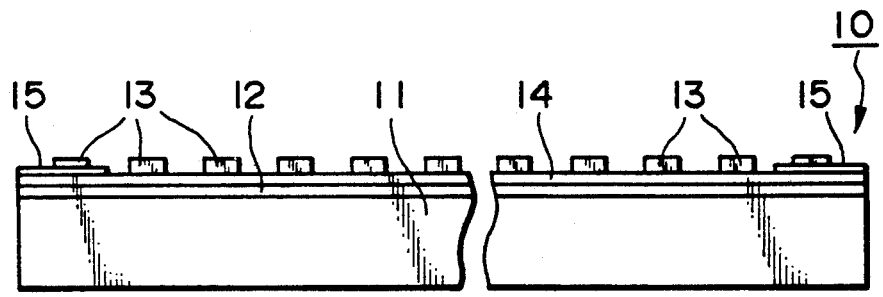
FIG. 5 is a side view of the light emitting element array substrate shown in FIG. 4.

Referring now to FIGS. 4 and 5, there is shown one embodiment of an LED array substrate constructed in accordance with the present invention. As shown in FIG. 5, the LED array substrate 10 comprises a base 11 and a copper pattern 12 formed on the top of the base 11. The copper pattern 12 is further plated with gold. A plurality of LED chips 13 are further mounted on the gold-plated copper pattern 12 by means such as die-bonding or wire-bonding. A substrate protecting layer 14 of thermosetting resin is formed about the LED chips 13 such as by printing a green-colored resist on the substrate. Only at the opposite ends of the LED array substrate 10, light reflecting members 15 are formed on the substrate protecting layer (green-colored resist layer) 14. The light reflecting members 15 may be of white-colored resist which is formed by the silk-screen printing technique. It is desirable that the size (area) of each of the light reflecting members 15 is selected to make the irradiation at the corresponding end of the LED array substrate 10 equal to that of the central portion thereof.

Figure 6:
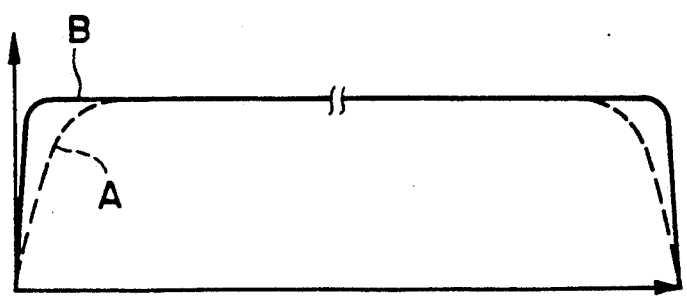
FIG. 6 is a graph illustrating the characteristics of irradiation in the light emitting element array substrates constructed in accordance with the present invention and related art, respectively.

When the irradiation in the resulting LED array substrate 10 was measured, it was found that the quantity of light in the LED array substrate 10 of the present invention will not decrease even at the opposite ends thereof in the presence of the light reflecting members (white-colored resist) 15, as shown by the solid line in FIG. 6. On the contrary, if only the green-colored resist layer 14 is formed on the LED array substrate as in the related art, the quantity of light in the LED array substrate at each end decreases as shown by the broken line in FIG. 6.

This results from the fact that the light reflected by parts around the surface to be irradiated back to the LED array substrate 10 is again reflected by the light reflecting members 15 back to the surface. Particularly, even if an LED chip on each end of the LED array substrate 10 can be complemented only by a single LED chip adjacent thereto, the irradiation thereof can be complemented by the reflecting light. Therefore, the quantity of light can be leveled throughout the surface. The LED array substrate of the present invention can be used in the image sensor which requires a LED array substrate having a reduced dispersion in quantity of light.

Although the embodiment of the present invention has been described with reference to the LED chips 13 mounted on the base 11 through die-bonding or wire-bonding, it may be replaced by soldering molded LED electrodes on the base 11.

Although the embodiment of the present invention has been described as having white-colored resist (15) formed on the substrate base 11 at the opposite ends, the white-colored resist may be replaced by light reflecting members which comprise aluminum films formed by depositing aluminum or applying aluminum tape onto the substrate base 11 at the opposite ends, when it is required to increase the quantity of light therein.

It is also desirable that the light reflecting members 15 have color and brightness sufficient to reflect the light of the light emitting elements which is of a wavelength which is used more than the other light of different wavelengths.

Figure 7:
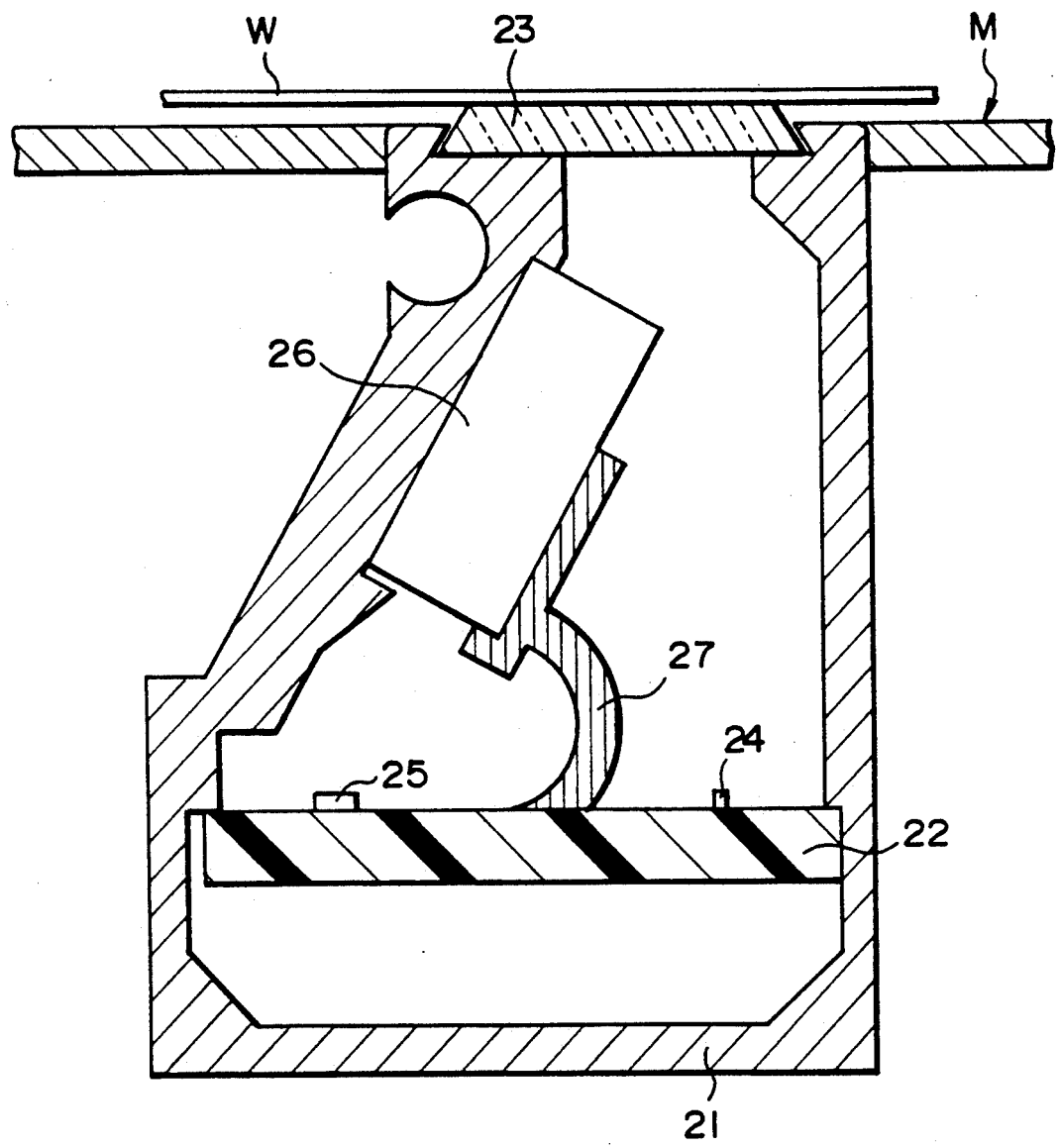
FIG. 7 is a cross-sectional view of an electronic instrument which incorporates a light emitting element array substrate constructed in accordance with the present invention.

FIG. 7 shows an electronic instrument M comprising an image sensor which incorporates an LED array substrate with light reflecting members constructed in accordance with the present invention. The image sensor comprises a frame 21 of aluminum, a substrate 22 mounted in the lower portion of the frame 21 and a glass cover 23 mounted as a transparent cover in the upper portion of the frame 21. The substrate 22 includes a light emitting section 24 comprising light reflecting members of the present invention and LED chips and a light receiving section 25 consisting of photodiode chips and other components, both of which are mounted in place on the substrate 22. The substrate 22 also includes any suitable wiring pattern formed on the top thereof. A condensing lens (gradient index lens) 26 is urged and held against the inner wall of the frame 21 by a lens holder 27 which is attached to the frame 21.

In such an arrangement, light emitted from the light emitting section 24 is incident on an original document W placed on the glass cover 23 in a direction substantially perpendicular to the plane of the document. The light is reflected by the document W slantingly relative to the glass cover 23 and then passes through the condenser lens 26 in the reflection path. After passing through the condenser lens 26, the light is received by the light receiving section 25 wherein it is converted into electrical signals.

All the light emitting section 24, light receiving section 25 and condenser lens 26 are elongated in a direction perpendicular to the plane of the drawings. Thus, the electrical signals will be provided one line at a time. When the document W is moved rightward or leftward as viewed in FIG. 7, data in the next line on the document W can be read out by the image sensor.

If the LED array substrate of the present invention is used and when the image of the document W is to be read, the irradiation of the LED array substrate can be leveled from the opposite ends to the central portion of the substrate. Therefore, the image of the document W can be accurately read by the image sensor. Furthermore, the cost in parts and assembling will not be increased since the leveling of irradiation can be attained without the need of any special components (light reflecting members surrounding the optical path from the light emitting section to the document or LED elements having an increased quantity of light and being used at particular locations), light compensating circuit and the like.

Figure 8:
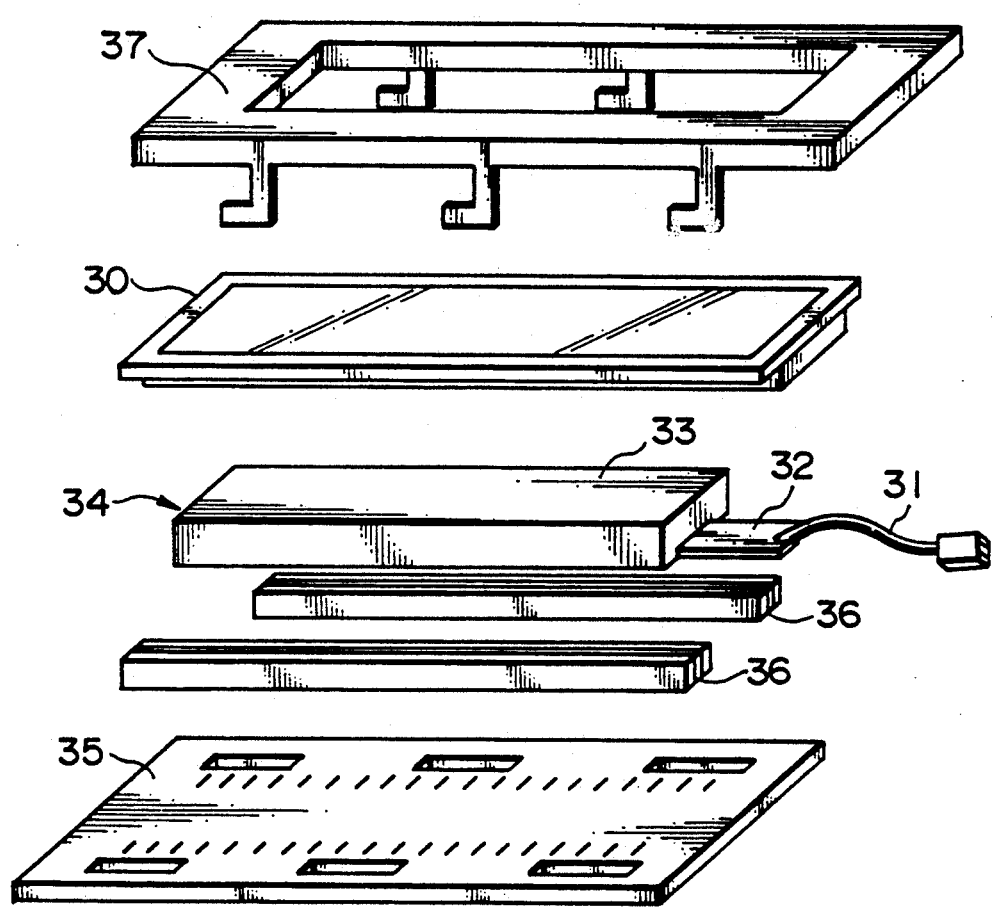
FIG. 8 is an exploded perspective view of a liquid crystal display which is provided with a back-light including a light emitting element array substrate constructed in accordance with the present invention.

FIG. 8 shows a liquid crystal display which uses a back-light including an LED array substrate of the present invention.

Since the liquid crystal display itself cannot emit any light, it is required to be irradiated by the back-light from the back side thereof.

A plurality of LED array substrates 32 are mounted in the interior of a cover 33 to provide a back-light 34 for illuminating a liquid crystal display panel 30 and are supplied with a power through a connector 31. The back-light 34 is sandwiched between the liquid crystal display panel 30 and a substrate 35 for energizing the display panel 30 so that the latter will be illuminated by the back-light 34 from the back side. The liquid crystal display panel 30 is electrically connected to the substrate 35 through electrically conductive members 36. An outer panel 37 having L-shaped hooks is used to fix the liquid crystal display panel 30, back-light 34 and conductive members 36 to the substrate 35.

When the LED array substrate of the present invention is used in the liquid crystal display panel as a back-light 34, the liquid crystal display can be provided which emits a uniform light through the entire area thereof and can be more easily viewed, without fear of any increase in the number of parts or the assembling cost, since any special components, light compensating circuit and others are not required.

I claim:

1. A light emitting element array substrate comprising a plurality of light emitting elements arranged on the substrate in a line and light reflecting means provided on a portion of said substrate around light emitting elements where the quantity of irradiation is less than that at an other portion of the substrate, said light reflecting means positioned to re-reflect the light which is emitted from said light emitting elements and then reflected by surrounding parts, so that said re-reflected light complements the quantity of light where the irradiation is less than the other portions and levels the entire irradiation from the light emitting element array substrate.

2. A light emitting element array substrate as defined in claim 1 wherein said light reflecting means is formed on said substrate about the light emitting element at each end.

3. A light emitting element array substrate as defined in claim 1 wherein said light reflecting means is formed of thermosetting resin and has color and brightness sufficient to reflect the light in the light emitting elements of the wavelength that is used more than the other wavelengths.

4. A light emitting element array substrate as defined in claim 1 wherein said light reflecting means is formed of aluminum film.

5. A light emitting element array substrate as defined in claim 1 wherein said light reflecting means has a size sufficient to level the irradiation from all of said light emitting elements.

6. An electronic instrument comprising a light emitting element array substrate which includes a plurality of light emitting elements arranged on said substrate in a line, said light emitting element array substrate further including light reflecting means provided on a portion of said substrate around light emitting elements where the quantity of irradiation is less than that at an other portion of the substrate, said light reflecting means positioned to re-reflect the light which is emitted from said light emitting elements and then reflected by surrounding parts, so that said re-reflected light complements the quantity of light where the irradiation is less than the other portion and levels the entire irradiation from the light emitting element array substrate.

7. An electronic instrument as defined in claim 6 wherein said light reflecting means is formed on said substrate about the light emitting element at each end.

8. An electronic instrument as defined in claim 6 wherein said light reflecting means is formed of thermosetting resin and has color and brightness sufficient to reflect the light in the light emitting elements of the wavelength which is used more than the other wavelengths.

9. An electronic instrument as defined in claim 6 wherein said light reflecting means is formed of aluminum film.

10. An electronic instrument as defined in claim 6 wherein said light reflecting means has a size sufficient to level the irradiation from all of said light emitting elements.

11. An electronic instrument comprising an image sensor for irradiating light to an object to be sensed and receiving the reflected light to convert the image of said object into electrical signals, said electronic instrument further comprising:

(a) a transparent cover on which said object is placed;

(b) a light emitting section for irradiating light to said object through the transparent cover, said light emitting section including light reflecting means provided on a portion of said substrate around light emitting elements where the quantity of irradiation is less than that at an other portion to the substrate, said light reflecting means positioned to re-reflect the light which is emitted from said light emitting elements and then reflected by surrounding parts, so that said re-reflected light complements the quantity of light where the irradiation is less than the other portion and levels the entire irradiation from the light emitting element array substrate;

(c) a condensing lens for receiving and condensing the light reflected by said object through said transparent cover;

(d) a light receiving section for receiving and converting the light from said condensing lens into electrical signals; and (e) a main frame on the top of which said transparent cover is mounted, said main frame enclosing said light emitting section, condensing lens and light receiving section.

12. An electronic instrument as defined in claim 11 wherein said light reflecting means is formed on said substrate about the light emitting element at each end.

13. An electronic instrument as defined in claim 11 wherein said light reflecting means is formed of thermosetting resin and has color and brightness sufficient to reflect the light in the light emitting elements of the wavelength which is used more than the other wavelengths.

14. An electronic instrument as defined in claim 11 wherein said light reflecting means is formed of aluminum film.

15. An electronic instrument as defined in claim 11 wherein said light reflecting means has a size sufficient to level the irradiation from all of said light emitting elements.

* * * * *